United States Patent
Chen

(10) Patent No.: US 9,153,568 B2
(45) Date of Patent: Oct. 6, 2015

(54) CHIP, ELECTROSTATIC DISCHARGE PROTECTION DEVICE AND FABRICATION THEREOF

(71) Applicant: ISSC Technologies Corp., Hsinchu (TW)

(72) Inventor: Che-Hong Chen, Hsinchu (TW)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/156,729

(22) Filed: Jan. 16, 2014

(65) Prior Publication Data
US 2015/0108538 A1 Apr. 23, 2015

(30) Foreign Application Priority Data

Oct. 23, 2013 (TW) .............................. 102138222 A

(51) Int. Cl.
*H01L 29/66* (2006.01)
*H01L 27/02* (2006.01)
*H01L 21/22* (2006.01)

(52) U.S. Cl.
CPC ............ *H01L 27/0248* (2013.01); *H01L 21/22* (2013.01)

(58) Field of Classification Search
USPC ........................ 257/107, 173; 438/133; 361/56
See application file for complete search history.

(56) References Cited

U.S. PATENT DOCUMENTS

| | | | | |
|---|---|---|---|---|
| 6,236,087 B1 * | 5/2001 | Daly et al. | ..................... | 257/355 |
| 6,849,902 B1 * | 2/2005 | Lin | ................ | 257/355 |
| 7,202,114 B2 * | 4/2007 | Salcedo et al. | ................ | 438/133 |
| 7,888,739 B2 * | 2/2011 | Jeon et al. | ..................... | 257/355 |
| 8,304,838 B1 | 11/2012 | Chen et al. | ..................... | 257/370 |
| 8,384,158 B2 * | 2/2013 | Su et al. | ..................... | 257/360 |
| 8,842,400 B2 * | 9/2014 | Ker et al. | ......................... | 361/56 |
| 2006/0244071 A1 * | 11/2006 | Kondo | ......................... | 257/355 |
| 2009/0020818 A1 * | 1/2009 | Voldman | ..................... | 257/357 |
| 2010/0109043 A1 * | 5/2010 | Wang et al. | ..................... | 257/133 |

FOREIGN PATENT DOCUMENTS

| | | | | |
|---|---|---|---|---|
| TW | 437048 B | 5/2001 | ............. | H01L 23/60 |
| TW | 201310602 A | 3/2013 | ............. | H01L 23/60 |

* cited by examiner

*Primary Examiner* — David Vu
*Assistant Examiner* — Brandon Fox
(74) *Attorney, Agent, or Firm* — Slayden Grubert Beard PLLC

(57) ABSTRACT

An electrostatic discharge protection device is disclosed. The electrostatic discharge protection device comprises a N+ well, a P doping region, a first N doping region, a plurality of N sub-doping regions, a first N+ doping region, a first P+ doping region, a second N+ doping region, and a second doping region. The P doping region is disposed in the N+ well. The first N doping region is disposed in the P doping region. The plurality of N sub-doping regions is disposed in parallel in the P doping region. The first N+ doping region is disposed in the first N doping region. The first P+ doping region is disposed in the first N doping region. The second N+ doping region is disposed in the P doping region.

10 Claims, 6 Drawing Sheets

CHIP, ELECTROSTATIC DISCHARGE PROTECTION DEVICE AND FABRICATION THEREOF

BACKGROUND OF THE INVENTION

1. Field of the Invention

The instant disclosure relates to an electrostatic discharge protection device; in particular, to electrostatic discharge protection element and manufacturing method thereof.

2. Description of Related Art

Generally speaking, voltage released form electrostatic discharge (ESD) is much larger than power voltage in the normal operation. In actual application situation, ESD from any source may probably damage electronic product. When the sudden ESD event happens, the ESD current may burn the element instantly. In other words, when a semiconductor device touches human body or device with charge, static electricity carried by human body or device with charge may be discharged to internal circuit of the semiconductor device from I/O pad to external pin, such that transient current with big energy flows into internal circuit so as to seriously damage the semiconductor device. Additionally, when semiconductor device with charge touches the device, static electricity carried by the internal circuit of the semiconductor device may be discharged to the external. In this situation, it may probably lead to damage for the semiconductor device due to transient current flowing into internal circuit. Therefore, in most semiconductor integrated circuits, the ESD protection circuit is disposed between I/O pad of the semiconductor device and the internal circuit so as to avoid damage of ESD.

To overcome above-mentioned problems, ESD protection circuit is usually arranged in the circuit so as to effectively isolate ESD current and avoid damage elements, wherein a silicon-controlled rectifier (SCR) is common ESD protection circuit. However, silicon-controlled rectifier regarding protection circuit may generate latch-up phenomenon in usage. Accordingly, how to solve latch-up phenomenon of the silicon-controlled rectifier is a problem urgently needed to solve.

SUMMARY OF THE INVENTION

The instant disclosure provides an electrostatic discharge protection device. The electrostatic discharge protection device comprises an N well, a P type doping region, a first N type doping region, a plurality of N type sub-doping regions, a first N+ type doping region, a first P+ type doping region and a second N+ doping region. The P type doping region is disposed in the N well. The first N type doping region is disposed in the P type doping region. The plurality of N type sub-doping regions are disposed in the P type doping region in parallel, wherein the N type sub-doping regions do not contact to the first N type doping region, and the N type sub-doping regions are electrically connected to a first source rail-line. The first N+ type doping region is disposed in the first N type doping region. The first P+ type doping region is disposed in the first N doping region, wherein the first N+ doping region and the first P+ doping region are electrically connected to a pad. The second N+ doping region is disposed in the P type doping region, wherein second P+ type doping region and the second N+ doping region are electrically connected to a second source rail-line. The N type sub-doping regions are disposed between the first N type doping region and the second N+ doping region.

In an embodiment of the instant disclosure, the electrostatic discharge protection device is a silicon-controlled rectifier, and the N well is disposed in a substrate, and doping concentration of the N well is lower than doping concentration of the first N type doping region.

In an embodiment of the instant disclosure, when the first source rail-line is electrically connected to a system voltage and the second source rail-line is electrically connected to a ground voltage, there is a depletion region generated between the N type sub-doping region and the P type doping region so as to block a channel current between the first N+ type doping region and the second N+ type doping region.

In an embodiment of the instant disclosure, when the first source rail-line is electrically connected to a system voltage and the second source rail-line is electrically connected to a ground voltage, a holding voltage and a trigger voltage both increase and holding voltage is larger than the system voltage.

In an embodiment of the instant disclosure, the P type doping region is P type graded region.

In an embodiment of the instant disclosure, the first N type doping region is N type graded region and the N type sub-doping regions are N type graded region.

The instant disclosure another provides a manufacturing method for an electrostatic discharge protection device, the manufacturing method comprises steps as follows: providing a substrate; forming a N well in the substrate; forming a P type doping region in the N well; forming a first N type doping region in the P type doping region; forming a plurality of N type sub-doping regions in parallel in the P type doping region, wherein the N type sub-doping regions do not contact to the first N type doping region, and the N type sub-doping regions are electrically connected to a first source rail-line; forming a first N+ type doping region in the first N type doping region; forming a first P+ doping region in the first N type doping region, and the first P+ doping region is connected next to the first N+ type doping region, wherein the first N+ type doping region and the first P+ doping region are electrically connected to a pad; forming a second N+ type doping region in the P type doping region; and forming a second P+ doping region in the P type doping region and the second P+ doping region connected next to the second N+ type doping region, wherein the second P+ doping region and the second N+ type doping region are connected to a second source rail-line.

The instant disclosure another provides a chip, and the chip comprises a core circuit, a first source rail-line, a second source rail-line and a plurality of pad units, surrounding the core circuit. Each of the plurality of pad units comprises a pad and an electrostatic discharge protection device. The pad is electrically connected to the pad circuit. The electrostatic discharge protection device is disposed next to the pad and is electrically connected to the first source rail-line and the second source rail-line, wherein the electrostatic discharge protection device of each of the plurality of pad units is disposed between the first source rail-line and the second source rail-line.

In summary, the chip, the electrostatic discharge protection device and manufacturing method thereof provided by the instant disclosure is able to do that when the first source rail-line is electrically connected to a system voltage and the second source rail-line is electrically connected to a ground voltage, there is a depletion region generated between the N type sub-doping region and the P type doping region so as to block a channel current between the first N+ type doping region and the second N+ type doping region, so as to increase the holding voltage of the electrostatic discharge protection device and avoid latch-up effect.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the present disclosure. As used herein, the term "and/or" includes any and all combinations of one or more of the associated listed items.

One Embodiment of the Chip

Figure 1:
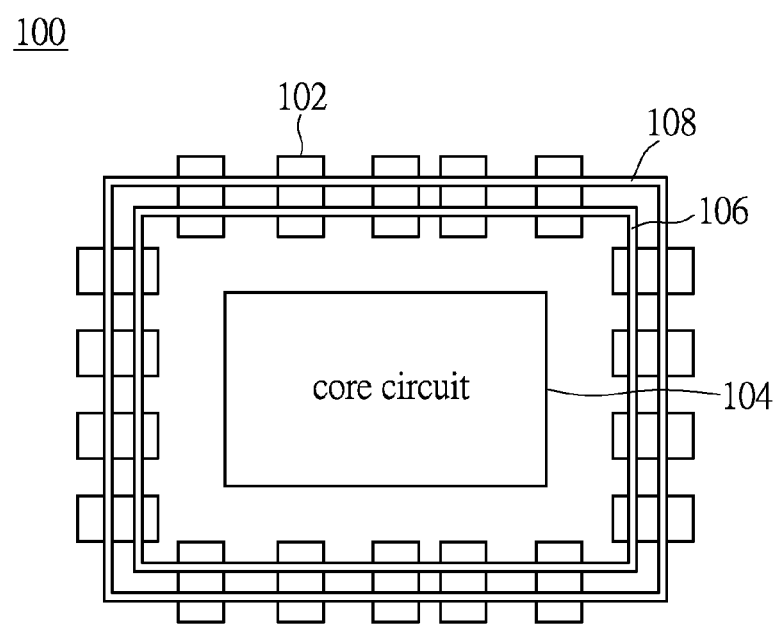
FIG. 1 shows schematic diagram of the chip according to the embodiment of the instant disclosure.

Referring to FIG. 1, FIG. 1 shows schematic diagram of the chip according to the embodiment of the instant disclosure. The chip comprises a plurality of pad units 102 connected to external element, and each of the plurality of pad units 102 are electrically connected to a system voltage rail-line 106 and the ground voltage rail-line 108. The pad unit 102 may comprise an I/O pad unit, a system voltage pad unit and a ground pad unit. Each of the plurality of pad units 102 above-mentioned has a pad and an electrostatic discharge protection device. Each electrostatic discharge protection device is disposed next to the pad correspondingly. The pad in the system voltage pad unit is electrically connected to the first source rail-line, such as the system voltage rail-line 106, so the system voltage is transmitted to the system voltage rail-line 106 by the system voltage rail-line 106 by an external system. The pad in the ground pad unit is electrically connected to the second source rail-line, such as the ground voltage rail-line 108, so the ground voltage is transmitted to the ground voltage rail-line 108 by the external system. Via transmission of the system voltage rail-line 106 and the ground voltage rail-line 108, operating power is provided to the core circuit 104 by the external system.

For a specific instruction on an operation process of the chip 100 of the instant disclosure, there is at least one of the embodiments for further instruction.

In the following embodiments, there are only parts different from embodiments in FIG. 1 described, and the omitted parts are indicated to be identical to the embodiments in FIG. 1. In addition, for an easy instruction, similar reference numbers or symbols refer to elements alike.

One Embodiment of the Electrostatic Discharge Protection Device

An electronic element, such as integrated circuit, tends to suffer from electrostatic discharge (ESD) shocks in real-world environments. The most common practice is to design an ESD protection device between the core circuit and the pad so as to protect internal circuit. In other words, modern electronic devices are often to be damaged by transient ESD called discharge of "ESD". When people with the body accumulated static charge touch or operate electronic devices, ESD events usually occur, wherein electrostatic charge accumulation may be occurred because people move through the felt surface or certain types of clothing or other reasons. In any case, when a person charged or other objects touches electronic devices, the accumulated charge sudden discharges via electronic devices so as to lead to catastrophic damage to electronic devices. Therefore, the electronic devices may comprise internal ESD protection.

Figure 2:
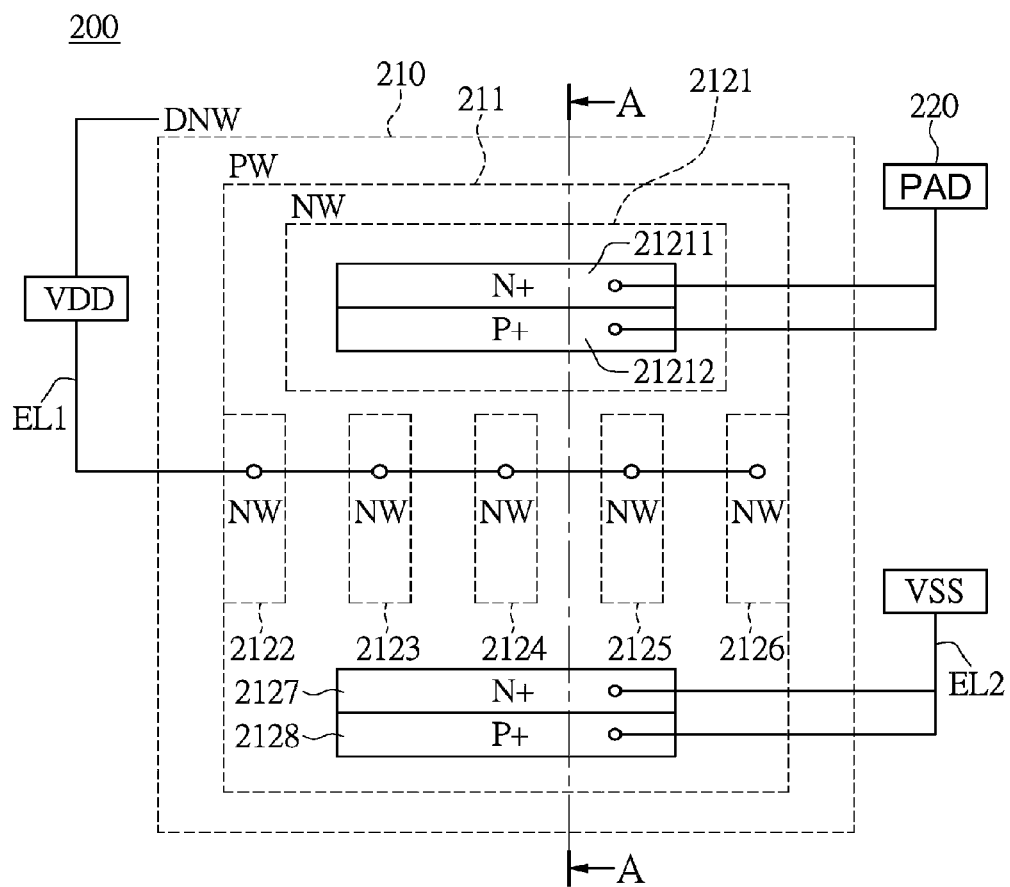
FIG. 2 shows transistor layout schematic diagram of the electrostatic discharge protection device according to the embodiment of the instant disclosure.
Figure 3:
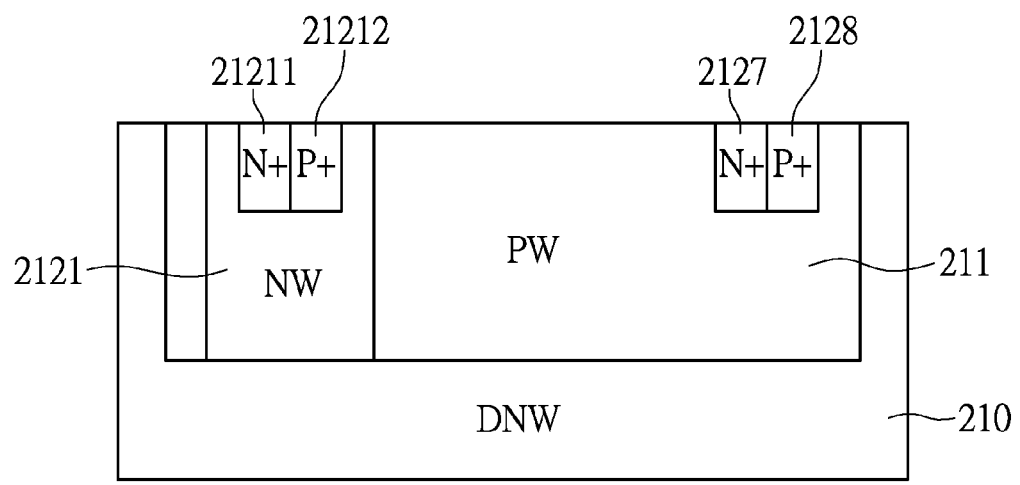
FIG. 3 shows sectional view along sectional line A-A of the electrostatic discharge protection device according to FIG. 2.

Referring to FIGS. 2 and 3, FIG. 2 shows transistor layout schematic diagram of the electrostatic discharge protection device according to the embodiment of the instant disclosure. FIG. 3 shows sectional view along sectional line A-A of the electrostatic discharge protection device according to FIG. 2. In the present embodiment, the electrostatic discharge protection device 200 is Silicon-Controlled Rectifier (SCR). The electrostatic discharge protection device 200 comprises an N well 210, a P type doping region 211, a first N type doping region 2121, a plurality of the N type sub-doping regions 2112~2126, a first N+ type doping region 21211, a first P+ doping region 21212, a second N+ type doping region 2127 and a second P+ doping region 2128. Generally speaking, a substrate may be provided in the IC process. The P type doping region 211 is disposed in the substrate. The P type doping region 211 is disposed in the N well 210. The first N type doping region 2121 is disposed in the P type doping region 211. The plurality of the N type sub-doping region 2122~2126 are disposed in the P type doping region 211 in parallel (as shown in FIG. 2), and the N type sub-doping regions 2122~2126 do not contact to the first N type doping region 2121, wherein the N type sub-doping regions 2122~2126 are electrically connected to the first source rail-line EL1. The first N+ type doping region 21211 is disposed in the first N type doping region 2121. The first P+ doping region 21212 is disposed in the first N type doping region 2121. In the present embodiment, the first P+ doping region 21212 is connected to next to the first N+ type doping region 21211, but the embodiment is not restricted thereto. The first N+ type doping region 21211 and the first P+ doping region 21212 is electrically connected to the pad 220 via metal conductive layer. The second N+ type doping region 2127 is disposed in the P type doping region 211. The second P+ doping region 2128 is disposed in the P type doping region 211. In the present embodiment, the second P+ doping region 2128 is connected next to the second N+ type doping region 2127, but the embodiment is not restricted thereto. The second P+ doping region 2128 and the second N+ type doping region 2127 are electrically connected to the second source rail-line EL2. The N type sub-doping regions 2122~2126 are disposed between the first N type doping region 2121 the second N+ type doping region 2127. As an aside, in the present embodiment, the P type doping region 211 is P type graded region, the first N type doping region 2121 is the N type graded region, the N type sub-doping region 2122~2126 is graded region, doping concentration of the N well 210 is lower than doping concentration of the first N type doping region 2121, and doping concentration of the first N type doping region 2121 is lower than doping concentration of the first N+ type doping region 21211 or the second N+ type doping region 2127.

It is to be noted that, for convenience understanding the instant disclosure, the electrostatic discharge protection device 200 has five N type sub-doping regions 2122~2126, but number of the N type sub-doping region should be based on actual use, and number of the N type sub-doping region is not restricted thereto.

A person skilled in the art should understand that for avoiding damage of IC resulted from ESD shock in the IC process, production and use, it must increase ESD protection circuit on the path connected to bonding wire for conducting ESD current so as to avoid damage of the internal circuit. Generally speaking, the SCR possess ability of the most SED current conduction in the unit area, and when ESD event happens in the first source rail-line EL1 or the second source rail-line EL2, the embedded SCR architecture of the electrostatic discharge protection device 200 in the ESD device will be triggered and lead the ESD discharge current to the second source rail-line EL2 or the first source rail-line EL1.

According to different voltage level of the ESD, the ESD can be broadly classified into a Human-Body Model (HBM), a Machine Model (MM) and a Charge-Device Model (CDM). The voltage of the ESD is much higher than system voltage under normal condition. When ESD event happen, the ESD current might burn the electronic elements. Accordingly, the electronic elements must be with ESD protection measures for effectively block ESD discharge current so as to avoid damaging element. Test of the ESD device can be classified into PD mode, PS mode, ND mode and NS mode. The PD mode is that positive impulse is inputted into the pad such that the system voltage rail-line is connected to ground. The ND mode is that negative impulse is inputted into the pad such that the system voltage rail-line is connected to ground. The PS mode is that positive impulse is inputted into the pad such that the ground voltage rail-line is connected to ground. The NS mode is that negative impulse is inputted into the pad such that the ground voltage rail-line is connected to ground. Generally speaking, SCR possess conduction ability of high current, but the holding voltage of the SCR is 1V-2V so as not to broaden its application. When the holding voltage is lower than the operating voltage and abnormal noise is fed in, latch-up effect of SCR happens so that IC may be damaged or generate abnormal current leakage lead to malfunction of SCR. In other words, some ESD circuits may be arranged in the circuit so as to effectively block ESD discharge current from damaging elements, wherein SCR protection circuit is common ESD protection circuit. However, ESD protection circuit composed of SCR may generate latch-up phenomenon at present.

For a specific instruction on an operation process of the electrostatic discharge protection device 200 of the instant disclosure, there is at least one of the embodiments for further instruction.

In the following embodiments, there are only parts different from embodiments in FIG. 2 described, and the omitted parts are indicated to be identical to the embodiments in FIG. 2. In addition, for an easy instruction, similar reference numbers or symbols refer to elements alike.

One Embodiment of the Electrostatic Discharge Protection Device

Figure 4:
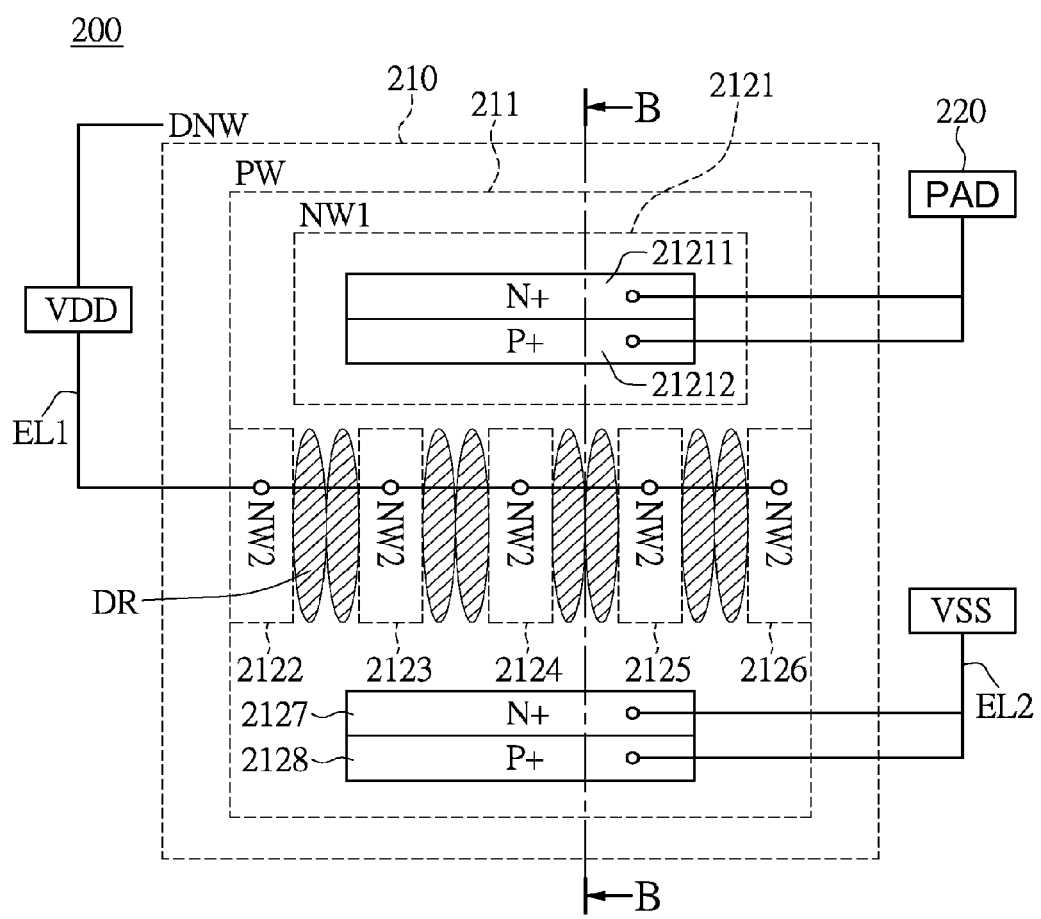
FIG. 4 shows transistor layout schematic view of the electrostatic discharge protection device according to one embodiment of the instant disclosure.
Figure 5:
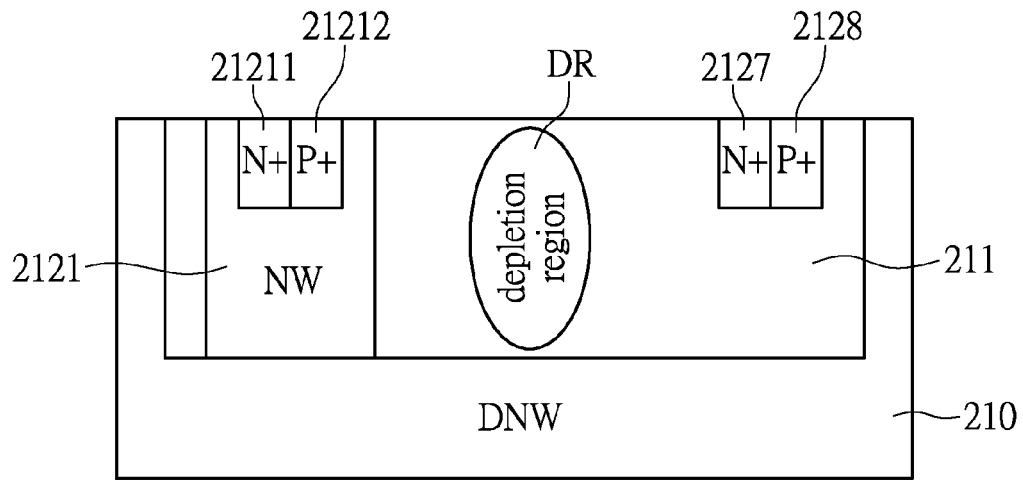
FIG. 5 shows sectional view along sectional line B-B according to FIG. 4.

Referring to FIGS. 4 and 5, FIG. 4 shows transistor layout schematic view of the electrostatic discharge protection device according to one embodiment of the instant disclosure. FIG. 5 shows sectional view along sectional line B-B according to FIG. 4. When the electrostatic discharge protection device 200 is in the process or the chip with the electrostatic discharge protection device is mounted on the circuit board and when the chip is suffered from electrostatic bombardment, the electrostatic discharge protection device 200 is able to steadily release ESD discharge current so as to avoid damaging the chip on the circuit board. In other words, because the first source rail-line EL1 is not yet electrically connected to the system voltage VDD and the second source rail-line EL2 is not yet electrically connected to the ground voltage, junction between the N type sub-doping regions 2122~2126 and the P type doping region 211 does not generate a depletion region DR. In the other hand, when the circuit board is connected to electrical power (i.e., chip of the electrostatic discharge protection device is turned-on by electrical power); which means, when the first source rail-line EL1 is electrically connected to the system voltage VDD and the second source rail-line EL2 is electrically connected to the ground voltage VSS, state of the N type sub-doping regions 2122~2126 is in the high voltage level and state of the P type doping region 211 is in the low voltage level via the second P+ doping region 2128. Accordingly, junction between the N type sub-doping region 2122~2126 and the P type doping region 211 may generate the depletion region DR due to reverse bias effect so as to block channel current between the first N+ type doping region 21211 and the second N+ type doping region 2127 (i.e., SCR does not exist) and avoid chip malfunction resulted from noise during circuit operation. Furthermore, in the normal operating state, it needs to properly elevate trigger level of the electrostatic discharge protection device 400 for avoiding mistakenly hit electrostatic discharge protection device. In the present embodiment, because SCR does not exist, the holding voltage and the trigger voltage of the electrostatic discharge protection device 400 may be increased. It is worth to be mentioned that the holding voltage of the electrostatic discharge protection device 400 is larger than the system voltage VDD.

Figure 6:
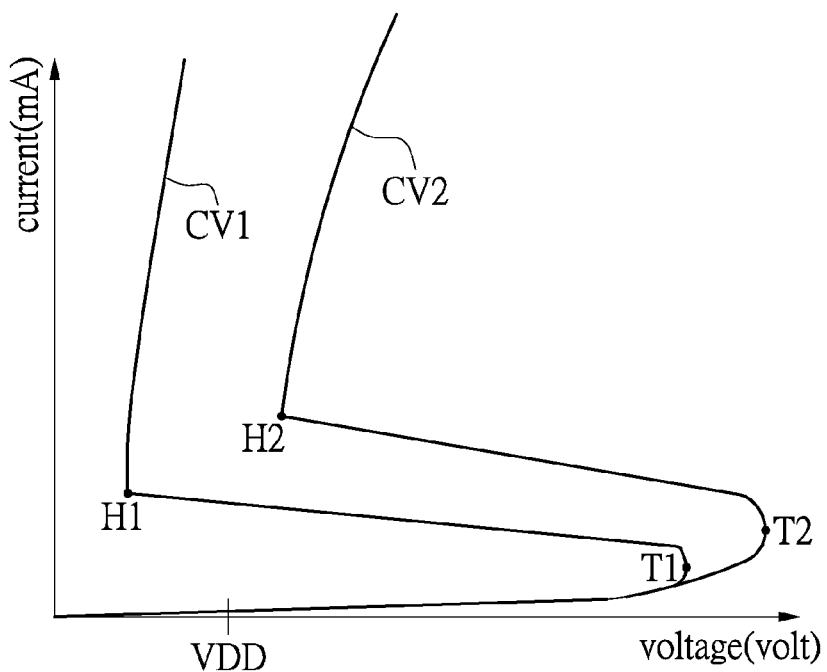
FIG. 6 shows curve view of snap back for the electrostatic discharge protection device according to the embodiment of the instant disclosure.

Referring to FIG. 6, FIG. 6 shows curve view of snap back for the electrostatic discharge protection device according to the embodiment of the instant disclosure. In the FIG. 6, the horizontal axis represents the voltage (in volts) and the vertical axis represents the current (in mA), and curve CV1 is curve of snap back for the traditional ESD elements and curve CV2 is curve of snap back for the ESD elements. Traditional ESD elements have the trigger voltage T1 and the holding voltage H1, wherein the holding voltage H1 is larger than the system voltage VDD. Via operation mechanism of the electrostatic discharge protection device 400 in the instant disclosure, the trigger voltage may be increased to the trigger voltage T2 and the holding voltage may be increased to the holding voltage H2, wherein the holding voltage H2 is larger than the system voltage VDD. In the present embodiment, the system voltage VDD is 3.3 volt, but the instant disclosure is not restricted thereto.

Figure 7:
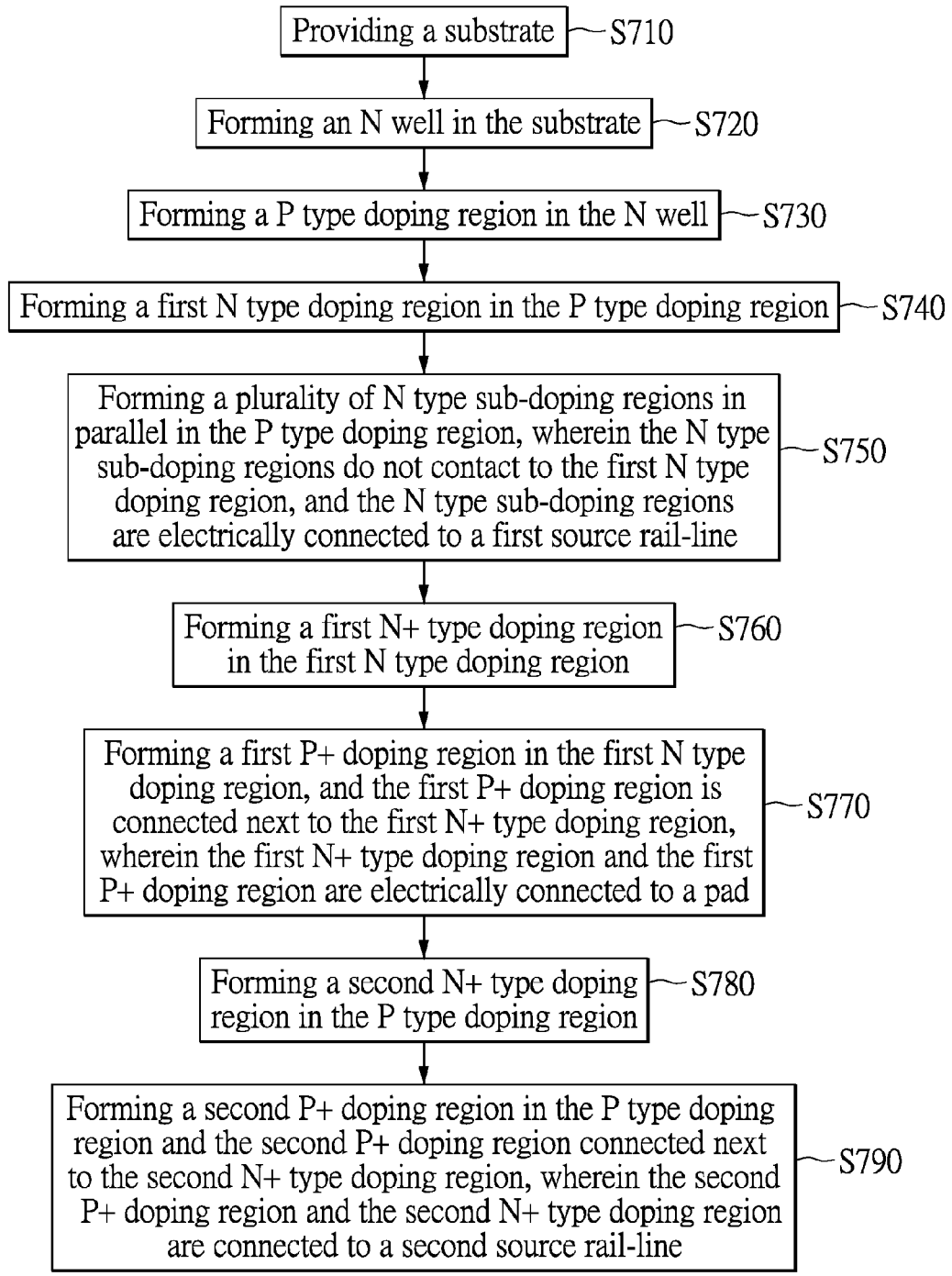
FIG. 7 shows flow chart of the manufacturing method for an electrostatic discharge protection device according to the embodiment of the instant disclosure.

One Embodiment of the Manufacturing Method for an Electrostatic Discharge Protection Device Referring to FIG. 7, FIG. 7 shows flow chart of the manufacturing method for an electrostatic discharge protection device according to the embodiment of the instant disclosure. The manufacturing method for an electrostatic discharge protection device comprises steps as follows:

Providing a substrate (step S710).

Forming a N well in the substrate (step S720).

Forming a P type doping region in the N well (step S730).

Forming a first N type doping region in the P type doping region (step S740).

Forming a plurality of N type sub-doping regions in parallel in the P type doping region, wherein the N type sub-doping regions do not contact to the first N type doping region, and the N type sub-doping regions are electrically connected to a first source rail-line (step S750).

Forming a first N+ type doping region in the first N type doping region (step S760).

Forming a first P+ doping region in the first N type doping region, and the first P+ doping region is connected next to the first N+ type doping region, wherein the first N+ type doping region and the first P+ doping region are electrically connected to a pad (step S770).

Forming a second N+ type doping region in the P type doping region (step S780).

Forming a second P+ doping region in the P type doping region and the second P+ doping region connected next to the second N+ type doping region, wherein the second P+ doping region and the second N+ type doping region are connected to a second source rail-line (step S790).

Relevant details of the steps of the manufacturing method regarding electrostatic discharge protection device are described in the embodiments of FIGS. 1-6, and thus it is not repeated thereto. It is clarified that, a sequence of steps in FIG. 7 is set for a need to instruct easily, and thus the sequence of the steps is not used as a condition in demonstrating the embodiments of the instant disclosure.

To sum up, the chip, the electrostatic discharge protection device and manufacturing method thereof provided by the instant disclosure is able to do that when the first source rail-line is electrically connected to a system voltage and the second source rail-line is electrically connected to a ground voltage, there is a depletion region generated between the N type sub-doping region and the P type doping region so as to block a channel current between the first N+ type doping region and the second N+ type doping region, so as to increase the holding voltage of the electrostatic discharge protection device and avoid latch-up effect.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An electrostatic discharge protection device, comprising:
   an N well;
   a P type doping region, disposed in the N well;
   a first N type doping region, disposed in the P type doping region;
   a plurality of N type sub-doping regions, disposed in the P type doping region in parallel, wherein the N type sub-doping regions do not contact to the first N type doping region, and the N type sub-doping regions are electrically connected to a first source rail-line;
   a first N+ type doping region, disposed in the first N type doping region;
   a first P+ type doping region, disposed in the first N doping region, wherein the first N+ doping region and the first P+ doping region are electrically connected to a pad;
   a second N+ doping region, disposed in the P type doping region, wherein second P+ type doping region and the second N+ doping region are electrically connected to a second source rail-line;
   wherein the N type sub-doping regions are disposed between the first N type doping region and the second N+ doping region;
   wherein when the first source rail-line is electrically connected to a system voltage and the second source rail-line is electrically connected to a ground voltage, there is a depletion region generated between the N type sub-doping region and the P type doping region so as to block a channel current between the first N+ type doping region and the second N+ type doping region.

2. The electrostatic discharge protection device according to claim 1, wherein the electrostatic discharge protection device is a silicon-controlled rectifier, and the N well is disposed in a substrate, and doping concentration of the N well is lower than doping concentration of the first N type doping region.

3. The electrostatic discharge protection device according to claim 2, wherein when the first source rail-line is electrically connected to a system voltage and the second source rail-line is electrically connected to a ground voltage, a holding voltage and a trigger voltage both increase and holding voltage is larger than the system voltage.

4. The electrostatic discharge protection device according to claim 1, wherein the P type doping region is P type graded region.

5. The electrostatic discharge protection device according to claim 1, wherein the first N type doping region is N type graded region and the N type sub-doping regions are N type graded region.

6. A chip, comprising:
   a core circuit;
   a first source rail-line;
   a second source rail-line; and
   a plurality of pad units, surrounding the core circuit, each of the plurality of pad units comprising:
      a pad, electrically connected to the pad circuit; and
      an electrostatic discharge protection device according to claim 1, disposed next to the pad and electrically connected to the first source rail-line and the second source rail-line, wherein the electrostatic discharge protection device of each of the plurality of pad units is disposed between the first source rail-line and the second source rail-line;
      wherein when the first source rail-line is electrically connected to a system voltage and the second source rail-line is electrically connected to a ground voltage, there is a depletion region generated between the N type sub-doping region and the P type doping region so as to block a channel current between the first N+ type doping region and the second N+ type doping region.

7. A manufacturing method for an electrostatic discharge protection device, comprising:
  providing a substrate;
  forming a N well in the substrate;
  forming a P type doping region in the N well;
  forming a first N type doping region in the P type doping region;
  forming a plurality of N type sub-doping regions in parallel in the P type doping region, wherein the N type sub-doping regions do not contact to the first N type doping region, and the N type sub-doping regions are electrically connected to a first source rail-line;
  forming a first N+ type doping region in the first N type doping region;
  forming a first P+ doping region in the first N type doping region, and the first P+ doping region is connected next to the first N+ type doping region, wherein the first N+ type doping region and the first P+ doping region are electrically connected to a pad;
  forming a second N+ type doping region in the P type doping region; and
  forming a second P+ doping region in the P type doping region and the second P+ doping region connected next to the second N+ type doping region, wherein the second P+ doping region and the second N+ type doping region are connected to a second source rail-line, and when the first source rail-line is electrically connected to a system voltage and the second source rail-line is electrically connected to a ground voltage, there is a depletion region generated between the N type sub-doping region and the P type doping region so as to block a channel current between the first N+ type doping region and the second N+ type doping region.

8. The manufacturing method for an electrostatic discharge protection device according to claim 7, wherein the N type sub-doping regions are disposed between the first N type doping region and the second N+ type doping region.

9. The manufacturing method for an electrostatic discharge protection device according to claim 7, wherein the electrostatic discharge protection device is a silicon-controlled rectifier and the N well is disposed in a substrate.

10. The manufacturing method for an electrostatic discharge protection device according to claim 7, wherein when the first source rail-line is electrically connected to a system voltage and the second source rail-line is electrically connected to a ground voltage, a holding voltage and a trigger voltage both increase and holding voltage is larger than the system voltage.

* * * * *